(12) United States Patent
Paire et al.

(10) Patent No.: US 9,923,106 B2
(45) Date of Patent: Mar. 20, 2018

(54) METHOD FOR FABRICATING A PHOTOSENSITIVE DEVICE

(71) Applicants: ELECTRICITE DE FRANCE, Paris (FR); CENTRE NATIONAL DE LA RECHERCHE SCIENTIFIQUE—CNRS—, Paris (FR)

(72) Inventors: Myriam Paire, Paris (FR); Jean-Francois Guillemoles, Paris (FR); Laurent Lombez, Nanterre (FR); Daniel Lincot, Antony (FR); Stephane Collin, Paris (FR); Jean-Luc Pelouard, Paris (FR)

(73) Assignees: Electricite de France, Paris (FR); Centre National de la Recherche Scientifique—CNRS—, Paris (FR)

( * ) Notice: Subject to any disclaimer, the term of this patent is extended or adjusted under 35 U.S.C. 154(b) by 0 days.

(21) Appl. No.: 14/892,708

(22) PCT Filed: May 12, 2014

(86) PCT No.: PCT/FR2014/051093
§ 371 (c)(1),
(2) Date: Nov. 20, 2015

(87) PCT Pub. No.: WO2014/188105
PCT Pub. Date: Nov. 27, 2014

(65) Prior Publication Data
US 2016/0118511 A1    Apr. 28, 2016

(30) Foreign Application Priority Data

May 22, 2013  (FR) ..................................... 13 54618

(51) Int. Cl.
*H01L 31/0232* (2014.01)
*H01L 31/0216* (2014.01)
(Continued)

(52) U.S. Cl.
CPC .. *H01L 31/02327* (2013.01); *H01L 31/02161* (2013.01); *H01L 31/02168* (2013.01);
(Continued)

(58) Field of Classification Search
CPC ........... H01L 27/1462; H01L 27/14627; H01L 31/0232; H01L 31/107; H01L 31/02327;
(Continued)

(56) References Cited

U.S. PATENT DOCUMENTS

2008/0272450 A1* 11/2008 Tseng .................. H01L 27/1462
257/432
2011/0132764 A1   6/2011 Lincot et al.
(Continued)

FOREIGN PATENT DOCUMENTS

WO    2012/096239 A1    7/2012

*Primary Examiner* — Ermias Woldegeorgis
(74) *Attorney, Agent, or Firm* — Drinker Biddle & Reath LLP

(57) ABSTRACT

A method for fabricating a photosensitive device, comprising: a first step of preparing, on a substrate, at least a first photosensitive portion, active within a range of wavelengths, the first portion being surrounded by a second portion that is inactive. A material, covering the first portion, is selectively arranged into a hydrophilic layer by an electrochemical process. The second portion comprises a hydrophobic material on an upper surface opposite the substrate. The method further comprises the following steps: spraying on the upper surfaces of the first and second portions a liquid comprising a transparent material, and forming a converging lens containing the material, above the first portion.

18 Claims, 5 Drawing Sheets

(51) Int. Cl.
*H01L 31/054* (2014.01)
*H01L 31/18* (2006.01)
(52) U.S. Cl.
CPC .......... *H01L 31/0543* (2014.12); *H01L 31/18* (2013.01); *Y02E 10/52* (2013.01)
(58) Field of Classification Search
CPC ......... H01L 31/02161; H01L 31/02167; H01L 31/02168
See application file for complete search history.

(56) References Cited

U.S. PATENT DOCUMENTS

| | | | |
|---|---|---|---|
| 2012/0138121 A1 | 6/2012 | Izadian | |
| 2012/0279422 A1 | 11/2012 | Radivojevic et al. | |
| 2013/0122633 A1* | 5/2013 | Arase | G02B 3/0056 438/69 |

* cited by examiner

METHOD FOR FABRICATING A PHOTOSENSITIVE DEVICE

CROSS-REFERENCE TO RELATED APPLICATIONS

This application is the U.S. national phase of the International Patent Application No. PCT/FR2014/051093 filed May 12, 2014, which claims the benefit of French Application No. 13 54618 filed May 22, 2013, the entire content of which is incorporated herein by reference.

TECHNICAL FIELD

The invention relates to the field of optoelectronic devices equipped with light concentration systems.

TECHNOLOGICAL BACKGROUND

Technologies employing optoelectronic devices such as photodetectors, light emitting diodes (LED), or photovoltaic devices, can benefit from using less material to make the photoactive portions through the use of light concentration systems.

Devices employing light concentration systems require less semiconducting material to produce a given electric power or to illuminate a given area compared to devices without such systems. In the case of photovoltaic cells, the use of light concentration systems allows using lower cost light-absorbing materials with high conversion efficiency.

The alignment of light-concentrating optical systems over photosensitive devices is difficult to achieve. Conventionally, this alignment involves imaging methods such as camera control, which are expensive methods.

Generally, the alignment of optical systems over photosensitive cells is done cell by cell. This sequential alignment method involves precision robots which are often also used for positioning the cells on the host substrate. This technique has the disadvantage of being both expensive and longer to implement as the number of lenses and therefore cells increases.

Some manufacturers propose a prior photolithography step to facilitate the alignment of these "secondary" optical systems, in contact with the photosensitive cells, over these cells. The secondary optical systems are generally lenses, placed over the photosensitive cells and used in combination with the larger "primary" lenses. The primary lenses are located above the cells, at a distance substantially corresponding to their focal length. This method has the disadvantage of requiring an intrinsic alignment in order to define the lithography patterns at the appropriate places, taking into account the geometry of the photosensitive cells.

There is therefore a need to develop a method that simplifies the step of aligning light concentration systems over photosensitive devices.

SUMMARY

To achieve this, the present invention proposes a method that provides self-alignment of a light concentration system above photosensitive cells.

The invention more particularly proposes a method for fabricating a photosensitive device, comprising:
a first step of preparing, on a substrate, at least a photosensitive first portion. This photosensitive first portion is active within a specific range of wavelengths. A second inactive portion surrounds the first photosensitive portion.

Then, a material covering an upper surface of the first portion opposite the substrate is selectively arranged in a hydrophilic layer directly above the first active portion by an electrochemical process, while the second portion comprises a hydrophobic material on an upper surface opposite the substrate.

The method further comprises the steps of:
spraying, over the entire upper surfaces of the first and second portions, a liquid solution comprising a material that is transparent within the range of wavelengths in which the first portion is active, and
forming a converging lens comprising the transparent material, over the first portion.

This method therefore includes a first step of covering the upper surface of a photosensitive portion with a hydrophilic material, while the surrounding inactive portion has a hydrophobic upper surface. This contrast between the hydrophilic surface and the hydrophobic surface, selectively divided between the first active portion and the second inactive portion, allows the liquid solution deposited in a second step to form a drop, preferably above the hydrophilic surface and therefore above the photosensitive portion. The term "spraying" is to be understood in a broad sense, and can include a plurality of methods for applying a liquid solution, such as dipping, atomizing, or spin coating. The drop thus formed forms a light concentration system, in particular a converging lens. The alignment of the optical system over the photosensitive portion is therefore immediate. This method thus eliminates the need for expensive alignment devices and devices for positioning the lenses one at a time.

Another advantage of this method is that the hydrophobic and hydrophilic organization of the surface may not need any alignment or etching step. The upper surface of the first portion can be selectively rendered more or less hydrophilic. The term "selectively" render more or less hydrophilic means that no mask is used while implementing the electrochemical process that allows obtaining a hydrophilic layer directly above the first active portion. The selective nature of making such a hydrophilic layer is possible thanks to the properties of electrical conduction of the first active portion, as opposed to the second, electrically neutral portion.

A variety of electrochemical processes can be thought of to arrange the material covering the first portion into a hydrophilic layer. For example, such a hydrophilic layer can be obtained by an electrodeposition, selectively done on the first active portions due to the electrically conducting nature of these first portions. As an alternative, it is also possible to deposit a material that is initially hydrophobic to cover the first and second portions, and to implement a treatment by applying an electrical tension to the first active portion. This treatment renders the material selectively hydrophilic directly above the first active portions only.

Advantageously, the hydrophilic material is selectively deposited on the upper surface opposite the substrate of the first active portion. Deposition has the advantage of allowing selective positioning above the first or second portions. For example, when the first active portion is electrically conducting, the hydrophilic material can be selectively electrodeposited on the upper surface opposite the substrate of the first active portion.

It is also possible that the upper surface of the first portion opposite the substrate is rendered hydrophilic after treatment. Indeed, it is advantageous to be able to adjust the hydrophilic properties of a material deposited on the first active portion so as to distinguish its hydrophilicity from that of the second inactive portion. Alternatively, this possibility of modifying the hydrophilic properties of the deposited material allows for an embodiment wherein the upper surfaces of the first and the second portions are covered with the same material, and wherein a treatment, for example electrical, selectively renders hydrophilic only the areas directly above the first active portion.

The term hydrophilic refers here to the ability to form a film of liquid on the surface that has a contact angle of less than, for example, 90°. This property is not limited to a particular type of liquid. Similarly, the term hydrophobic refers here to the ability to form a liquid film on the surface that has a contact angle greater than, for example, 90°.

The method preferably comprises the deposition of a material having hydrophilic properties on the upper surface opposite the substrate in the first portion.

The hydrophilic properties of the deposited material are to be interpreted in their broadest meaning, namely that the deposited material can be inherently hydrophilic or it can be rendered hydrophilic by treatment. Similarly, it is possible to adjust the hydrophilicity of the deposited material.

In another embodiment, the upper surface opposite the substrate of the first portion can be rendered hydrophilic after treatment.

For example, it is possible to deposit the same material on the upper surface of the first and second portions, and then apply an electrochemical treatment that selectively renders hydrophilic only the material directly above the first active portion.

In practice, multiple materials can be used to cover the upper surface of the first photosensitive portion.

It is especially advantageous to use a wide-bandgap oxide, such as ZnO, doped ZnO, or $TiO_2$. These materials are particularly suitable for the method of the invention, given the existence of fast and inexpensive processes for the selective deposition of these oxides on photosensitive areas. For example, patent FR 2934611 discloses a method for electrodepositing ZnO selectively on the upper surfaces of the absorbers of photovoltaic cells, these absorbers being electrically conductive when illuminated. It is then advantageous to have a second inactive portion in which the upper surface is an electrical insulator.

Wide-bandgap oxides are advantageously subjected to a step of treatment by exposure to ultraviolet radiation prior to spraying a liquid solution on their upper surface. This exposure of the upper surface of the first active portion, coated with a wide-bandgap oxide, increases the hydrophilicity of the upper surface of the wide-bandgap oxide. This step prepares the upper surface to receive a liquid solution that forms drops on the hydrophilic material. It is to be noted that this treatment by exposure to ultraviolet radiation does not require the use of a mask either. The hydrophilicity of the hydrophobic areas, surrounding the hydrophilic material, is not affected by the exposure to ultraviolet radiation.

This step of treating the upper surface of the first active portion prior to the step of spraying a liquid solution may also be done by the application of an electrical potential, and therefore by the passage of an electrical current. Such a treatment comprising the application of an electric potential selectively increases the hydrophilicity of a material directly above the first active portion. This treatment exploits the property of the material, covering the first active portion, being at least partially electrically conductive.

These two electromagnetic treatments thus allow a selective increase of the hydrophilicity of the material directly above the first active portions.

Alternatively, it is possible to use deposition of at least one antireflection layer on the upper surface of the first active portion. The antireflection layer may be composed of a stack of multiple layers, which may be oxides. The use of an antireflection layer or a plurality of antireflection layers reduces the proportion of incident light reflected onto the light concentration system and thus increases the amount of light received by the first active portion. This layer or plurality of layers is/are arranged so as to be selectively deposited on the upper surface of the first active portion, and to have an exposed upper surface which is hydrophilic.

The liquid solution deposited on the exposed upper surfaces, directly above the first portion and second portion, may be selected from among a plurality of liquid solutions.

Advantageously, the liquid solution comprises a hardening material, for example a monomer.

For example, it may comprise a photosensitive resin that is transparent in the visible spectrum and has a high refractive index. Examples of such photosensitive resins are the photoresist SU8 or the photoresist AZ®40XT. It is possible to have a step of hardening the liquid solution to form a converging lens above the first portion. This may involve hardening by heat treatments or by exposure of the upper surface of the first portion, containing a drop of liquid solution, to ultraviolet radiation. This step occurs after the step of spraying a liquid solution on the exposed upper surfaces of the first and second portion. This hardening solidifies the shape of the lens above the first portion and ensures a permanent contact between the lens and the hydrophilic upper surface above the first active portion. The hardening step can also provide an additional degree of freedom in defining the shape of the lens, as the nature of certain curing processes affects this shape. Such is the case with thermal annealing, for example.

The first photosensitive portion may require the presence of electrical contacts. These contacts may be deposited, for example, between the first step of forming the first and second portions on the substrate, and the spraying step. These contacts are generally in the form of a hydrophilic metal layer in contact with the first portion. Alternatively, the deposition of metal contacts may be done during the first step of forming the first and second portions.

The additional advantage of the presence of these hydrophilic electrical contacts is that they extend the surface of the drop formed after the step of spraying the first photosensitive portion. It is indeed possible to use the electrical contacts to increase the size of the lens formed above the first portion. The amount of light collected by the light-concentrating device resulting from the method may then be sufficient for using the lens formed as the primary optical system. This simplifies the method for fabricating a panel comprising such photosensitive cells.

There are multiple possible applications for the method of the invention.

It can apply in particular to photovoltaic cells, in which case the first active portion is a light absorber of the photosensitive cell.

The second inactive portion is preferably an electrical insulator. Polymer-film electrical insulators offer the advantage of having hydrophobic surfaces. Other materials such as rare earth ceramics or rare earth oxides may also be considered for hydrophobic electrical insulators.

Once the lens is formed over the photosensitive cell, it is possible to thicken it by depositing a coating of a material that is transparent within the range of wavelengths where the photosensitive cell is active.

This coating acts as a spacer, thereby increasing the light collecting surface. The spacer also increases the distance between the upper surface of the lens and the photosensitive cell directly in line with the lens. This allows optimizing the position of the point of focus of the lens on the photosensitive cell.

The method can also be used on an industrial scale, for fabricating light-concentrating devices comprising a plurality of active portions. The first step then comprises the preparation, on a substrate, of an array of first portions that are active within a range of wavelengths and are separated from each other by a second inactive portion.

The creation of an array of active portions can be done using processes that use less raw material. In particular, it is advantageous, during the first step, to perform a selective deposition of the first portions on a substrate comprising the second portion. Alternatively, it is possible to deposit the first active portions on the substrate first, and then the second portion(s).

The method of the invention allows producing light-concentrating optoelectronic devices in which the lenses are aligned above the photosensitive regions with greater precision than in devices obtained by techniques known to a person skilled in the art.

The invention therefore also proposes a photosensitive device comprising, on a substrate:
  at least a first photosensitive portion which is active within a range of wavelengths,
  a second inactive portion, surrounding the first portion.

The photosensitive device has the distinctive feature that the first portion comprises a material selectively arranged into a hydrophilic layer directly above the first active portion by an electrochemical process on an upper surface opposite the substrate, while the upper surface opposite the substrate of the second portion comprises a hydrophobic material.

Furthermore, a converging lens formed on the upper surface of the hydrophilic material has an optical axis perpendicular to the substrate, aligned with the geometric center of the first portion. The misalignment between this optical axis and the geometric center of the first portion can be less than one nanometer.

This tiny misalignment between the optical axis of the lens and the geometric center of the first photosensitive portion can be smaller than the misalignment guaranteed by alignment techniques involving cameras and precision robots. Precision robots can accurately position lenses at intervals of about 100 nm. The method of the invention allows alignment of a lens with a photosensitive portion where the misalignment between the optical axis of the lens and the geometric center of the photosensitive portion is less than a nanometer. The device resulting from the method can therefore be particularly effective when the dimensions of the lens are small, for example micrometric in scale.

The device resulting from the method described above offers particularly advantageous optical quality for substantially circular lenses having diameters of less than 100 microns. With such lens sizes, a misalignment of the optical axis of the lens relative to the geometric center of the photosensitive portion can lead to aberrations that reduce the quality of the light concentration on the photosensitive portion.

BRIEF DESCRIPTION OF THE DRAWINGS

Other features and advantages of the invention will be apparent from the following detailed description of some exemplary embodiments given by way of illustration and not limitation, and with reference to the accompanying drawings in which.

For clarity, the dimensions of the various elements represented in the figures are not necessarily in proportion to their actual dimensions. Identical references in the figures correspond to identical elements.

DETAILED DESCRIPTION

Figure 1:
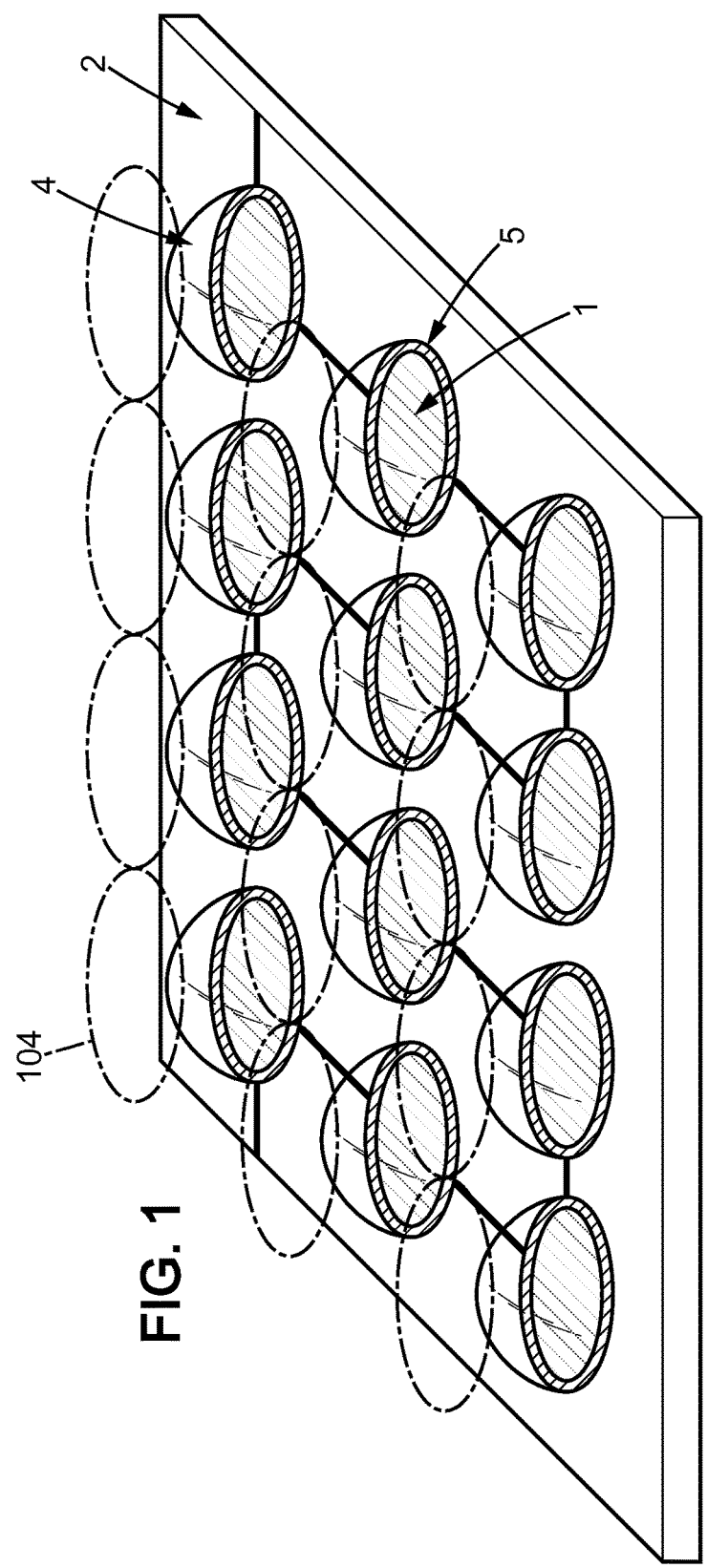
FIG. 1 illustrates an exemplary device that can be obtained by the method of the invention.

As illustrated in FIG. 1, the object of the present invention primarily concerns the fabrication of photosensitive systems with light concentration. Such systems may, for example, be arrays of devices such as photovoltaic cells 1, electrically connected by metal contacts 5. The photovoltaic cells are designed to be small, which reduces production costs and allows the use of materials providing high energy efficiency. These photosensitive cells 1 are equipped on their upper surfaces with lenses 4, forming "secondary" optical systems. Above these lenses, "primary" optical systems 104 focus light on the lenses 4. These primary optical systems are used to collect a greater amount of light due to their wider surface area, and to focus the light on the photovoltaic cells 1. The secondary optical systems 4, located under the primary optical systems 104, allow increasing the acceptance angle of the dual-level lens system, meaning that the photovoltaic cells 1 can collect more light reaching the primary optical systems 104 at non-normal incidence. Thus, more light is collected by the primary lenses 104, and the system also collects more light not perpendicular to the first lens plane 104 via the secondary optical systems 4. The method of the invention greatly facilitates the alignment of the secondary optical systems, the lenses 4, over the photosensitive cells 1.

Figure 2A:
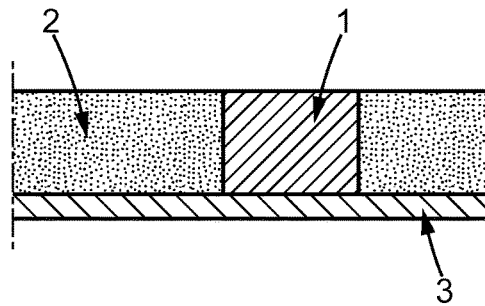
FIGS. 2a, 2b and 2c illustrate steps of a method for fabricating an active photosensitive portion equipped with a lens and surrounded by an inactive portion, according to a first embodiment of the invention.
Figure 2B:
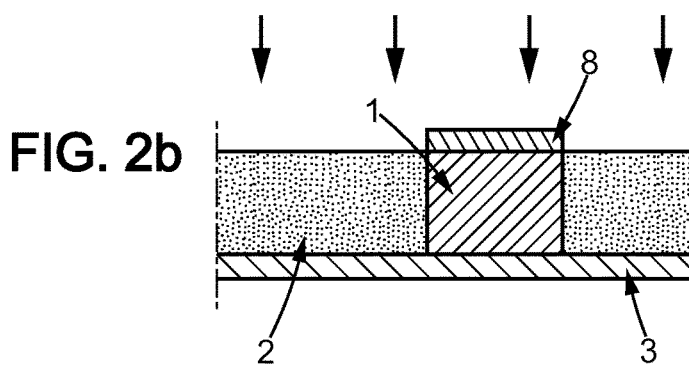
Figure 2C:
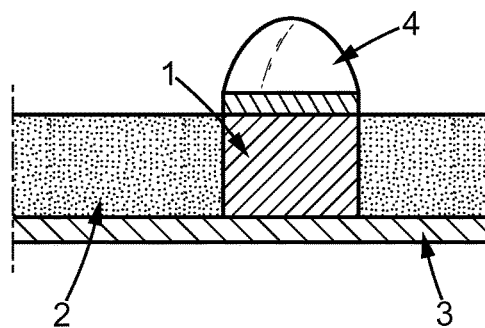

We will first refer to FIGS. 2a, 2b and 2c, which illustrate the steps of a method for fabricating an optoelectronic device, preferably a photosensitive device. The method consists of first fabricating, on a substrate 3, a first portion 1 surrounded by a second portion 2, as shown in FIG. 2a. The first portion 1 is active within a given range of wavelengths. The term "active" is understood to mean that the first portion 1 exhibits a noticeable photosensitivity or emission spectrum. For example, this noticeable photosensitivity or emission spectrum may be in the form of an absorption peak or emission peak. The techniques used to create these first 1 and second 2 portions may be the bottom-up methods known to persons skilled in the art, such as electro-deposition, printing, or co-evaporation through a mask. The surface of the first 1 and second 2 portions that is in contact with the substrate is referred to below as the lower surface. The surface opposite this surface is referred to as the upper surface.

As indicated in FIG. 2b, the upper surface of the first portion 1 is equipped with a layer 8 of a hydrophilic material. This layer 8 is selectively deposited on the upper face of the first portion 1 without touching the second portion 2.

The term hydrophilic is used here to refer to an ability to form surfaces with high wettability. More particularly, in the following description a material will be considered hydrophilic when depositing a liquid on its upper surface is accompanied by the formation of a drop of liquid having a contact angle that is less, for example, than 90°. The contact angle is defined as the angle between the surface and the tangent to the drop of liquid at the air/liquid/solid interface. The term hydrophilic does not limit the characteristic related to the wettable surface to a particular type of liquid, and can also serve to characterize materials intended to receive aqueous solutions, oils, or any other viscous liquid.

The term hydrophobic is used here to characterize materials that have an ability to form surfaces of lower wettability than the materials referred to herein as hydrophilic. In particular, a material is considered hydrophobic if the contact angle of the film of liquid deposited on its upper surface is greater, for example, than 90°.

The layer 8 of a hydrophilic material may be supplemented by a stack of several layers, the exposed upper surface having hydrophilic properties. For example, this particular embodiment may concern the case of an antireflection coating comprising a plurality of layers of materials having different refractive indices. In the particular case where the method consists of fabricating photovoltaic cells or photodetectors, the electrical connections of the first active portion 1 should be established before the deposition of this stack of layers. Indeed, the antireflection layers are often formed on the surface of a thin film of electrically insulating material. It is also possible for the layer 8 to have antireflection properties without requiring the deposition of one or a plurality of additional layers.

It should be noted that the shape of the first portion 1 is not necessarily circular. It is possible to fabricate a first portion 1 that has an elongated or rectangular shape for example. The hydrophilic layer 8 deposited on the surface of this first portion 1 advantageously follows the geometry of this first portion 1.

The layer 8 may advantageously be made of a material chosen from among wide-bandgap oxides. These materials are known for their hydrophilicity under UV illumination. In particular, zinc oxide (ZnO), possibly doped zinc oxide or titanium oxide ($TiO_2$) and indium tin oxide (ITO), are possible materials because they offer the advantage of easy deposition. Patent FR 2934611 discloses a method for electrodeposition of ZnO on $Cu(In,Ga)Se_2$ cells. It is particularly advantageous to use the teachings of this patent to perform deposition of a wide-bandgap oxide such as ZnO on the first portion 1 which is then in the form of photovoltaic cells. The electrodeposition of ZnO on the first portion 1 is selective and self-aligning, due to the electrically conductive nature of the absorber of a photovoltaic cell when illuminated. Many techniques for changing the roughness of these oxides are known to those skilled in the art, which can adjust their hydrophilicity. For example, etching with acid solutions such as aqueous solutions of hydrochloric acid can increase the roughness of these surface oxides.

To benefit from selective deposition of a wide-bandgap oxide such as ZnO onto a first active portion 1 by applying the teachings of patent FR 2,934,611, it is particularly advantageous to use a second inactive portion 2 which is an electrical insulator.

When the choice of material constituting the layer 8 uses a wide-bandgap oxide such as ZnO, it is advantageous to provide a step of exposing the upper surface of this layer 8 to ultraviolet radiation. Such step increases the hydrophilicity of the upper surface of the layer 8. The increase in hydrophilicity corresponds here to a decrease in the contact angle of a drop of liquid deposited on the upper surface of the layer 8.

Advantageously, the choice of material used to form the layer 8 takes into account the optical properties of this layer. It is particularly advantageous that the layer 8 be transparent within the same wavelengths as the range of wavelengths where the first portion 1 is active.

All the upper surfaces of the device created by the steps described above have the following features: the exposed surface that is directly above the first portion 1, which is active within a range of wavelengths, is hydrophilic, while the exposed surface directly above the second inactive portion 2 is hydrophobic.

The hydrophobicity of the exposed surface directly above the second inactive portion 2 may be an intrinsic property of the material used to fabricate the second inactive portion 2. For example, in a particular application where the first portion 1 is a photovoltaic cell, the second inactive portion 2 is advantageously an electrical insulator that naturally possesses hydrophobic properties. It may, for example, be selected from among temperature-resistant materials or polymers.

The insulating hydrophobic polymer films may be selected from among photosensitive resins (photoresists) such as SU8, or compounds derived from tetrafluoroethylene. It may be particularly advantageous to have materials suitable for the high temperatures that can be reached during annealing when fabricating the first portion 1. These hydrophobic materials, which are electrically insulating and heat-resistant, may be selected from among rare earth ceramics, or the materials used for sealing applications such as Therma Pur®. Among the rare earth ceramics, some may be deposited by thin film processes such as $CeO_2$ or $Er_2O_3$.

Furthermore, it is possible to carry out an additional step, prior to fabricating the first active portion 1, of depositing a layer of material having hydrophobic properties onto the upper surface of the second inactive portion 2. This is advantageous in the embodiment employing rare earth ceramics. It is also possible to use a stack of hydrophobic layers, for example a conventional inorganic insulating layer and a thin layer of rare earth ceramics, in order to deposit less ceramics. It is also possible to render the surface of the second portion 2 hydrophobic by grafting molecules after deposition of the photosensitive portion 1 and its annealing and before deposition of the ZnO layer 8. Thus, polymers such as octadecyltrichlorosilane (OTS) or perfluorodecyltrichlorosilane (PFTS) for example are preferably grafted on silica, which can serve as an electrical insulator to form the second portion 2, without being grafted on the metal contacts 5 or the ZnO.

As suggested by FIG. 2c, the method comprises a step of applying a liquid solution to all the upper surfaces of the device produced in the preceding steps. This liquid solution may be for example water, a solution containing monomers, or a solution containing polymers. The deposition of this liquid solution may advantageously be done by spraying, or by atomizing, dipping, or spin coating.

The contrast in hydrophilicity between the upper surface of the layer 8 and the upper surface of the second inactive portion 2 imposes a specific distribution of the liquid solution over all the exposed upper surfaces of the device created in the preceding steps. The liquid solution does not adhere to the hydrophobic surface and tends to flow off without forming drops, while it is retained in drop form on the upper surface of the layer 8. The contact angle of the drop on the upper surface of the layer 8 can vary according to the properties of the upper surface of the layer 8, the properties of the liquid solution and of the surrounding environment. It is therefore possible to select liquid solutions and deposition conditions, and to structure the upper surface of the layer 8 in a specific manner in order to obtain a drop of the desired shape. The radius of curvature of the lenses formed is thus an adjustable parameter of the method which in particular allows adjusting the focal distance of the lens. For example, depending on the amount of material provided during the application of the liquid solution, the drop may take the form of a dome or of a portion of a sphere.

In some applications, a specific shape may be given to the drop formed on the upper surface of the layer 8, by applying an electrical field.

Advantageously, the liquid solution is selected so that it possesses optical properties compatible with the range of wavelengths where the first portion 1 is active. It is advantageously transparent within this range of wavelengths.

Among the substances that the liquid solution can contain, it is possible to include a photosensitive resin such as the photoresist SU8, which polymerizes under ultraviolet radiation and is transparent in the visible spectrum.

In order to solidify the shape of the drop on the upper surface of the layer 8, it is possible to conduct a thermal treatment step, such as heating, or, for example for photoresists, exposure to radiation that solidifies the resin. In the case of the photoresist SU8, this is ultraviolet radiation.

Alternatively, in one particular embodiment it is possible not to subject the drop deposited on the first portion 1 to a liquid-solid transition.

Techniques known to the skilled person for controlling the shape and optical properties of lenses 4 formed in this manner can be applied. It is thus possible to adapt the composition of the monomer or polymer contained in the liquid solution in order to modify its viscosity. It is also possible to dip the lens 4 several times in succession in order to make it thicker.

Figure 3:
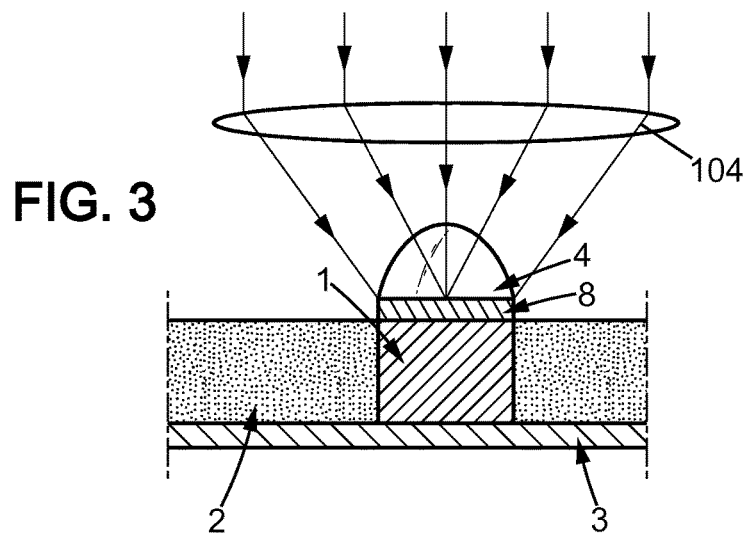
FIG. 3 illustrates a device obtained by the method of the invention according to a second embodiment.

To further optimize the concentration of light on the first active portion 1, it is possible to use, in combination with the device described above equipped with a self-aligning lens on an optoelectronic device, a second light concentration system 104 located directly above said lens 4, as represented in FIG. 3. The alignment of this second light concentration system, which may for example be a lens of greater focal length, uses alignment techniques known to the skilled person. This second light concentration system 104 allows collecting a greater amount of incident light. The savings in raw materials used to form the first active portion 1 is accompanied by a decrease of the upper surface of said first portion 1 exposed to incident radiation. It is therefore advantageous to provide the second concentration system 104 in order to compensate for this deficiency.

An alternative method of structuring the hydrophilic surface directly above the first active portion 1 is possible. This method consists of depositing a wide-bandgap oxide such as ZnO on the first 1 and second 2 portions. The deposition may be achieved by sputtering or chemical vapor deposition or by some other method. After or during the deposition of the ZnO, the substrate is dipped for example in a solution of fatty acid, to render the entire surface hydrophobic. An example of such a fatty acid is stearic acid. The creation of a hydrophilic area can then be done by exploiting the electrically conductive nature of the first portion 1 and the electrically insulating nature of the second portion 2. By placing it in an electrolyte, for example a dilute solution of $K_2SO_4$, and by passing an anode current through the first portion 1, which can then be directly polarized, the surface of the ZnO that is directly above the first portion 1 can be modified and the fatty acid present on the surface can be destroyed by the passage of an oxidation current. This creates a self-aligned hydrophilic area directly above the first portion 1, with the ZnO directly above the second portion 2 remaining hydrophobic.

The method thus described can be applied to different types of optoelectronic devices. For example, it is possible for the first portion 1 to be a light-emitting semiconductor, such as a LED, having electrical connections supplying current to the first portion 1. The method is particularly suitable for LEDs with a surface composed of a wide-bandgap oxide, such as InGaN-based diodes. Fabrication of a lens by using the method described above does not require any step of aligning said lens with the light-emitting diode. The lens spreads the light from the LED over a solid angle which depends on the optical properties of the lens.

Another particularly advantageous application relates to photosensitive devices, such as photodetectors or photovoltaic cells. Using the method described above reduces the surface area of the first portion 1, thus reducing production costs, and benefits from the increased energy efficiency provided by the light concentration system arranged directly above the first portion 1. The invention eliminates a costly step of aligning the light concentration systems over the first active portion 1.

In the particular case where the first portion 1 is a photovoltaic cell, the first portion 1 may advantageously be a light absorber. The latter may for example be fabricated of an alloy of $Cu(In,Ga)Se_2$, used in thin-film microcells. Other materials, preferably materials forming a light absorber able to receive a local deposition of oxides on its surface such as CdTe, CZTS, amorphous silicon, or monocrystalline silicon, are compatible with this method.

The embodiment where the first portion 1 is a light absorber of a photovoltaic cell offers an additional advantage. It allows the possibility, for applications associated with thin-film microcells, of eliminating the step of depositing the "buffer" layers of CdS and ZnS on top of the light absorber. These buffer layers are generally fabricated by chemical bath deposition, which is a non-selective process involving the deposition of a layer of CdS over the entire substrate. It is also possible to keep the buffer layers of ZnS or CdS and to deposit them selectively by electrodeposition, so as to maintain the hydrophobic character of the areas outside the photovoltaic cells.

By avoiding the deposition of these buffer layers or by making localized deposits, the user saves in production costs and retains the naturally hydrophobic chemical nature of the areas outside the photovoltaic cells, meaning the second inactive portion 2.

Figure 4A:
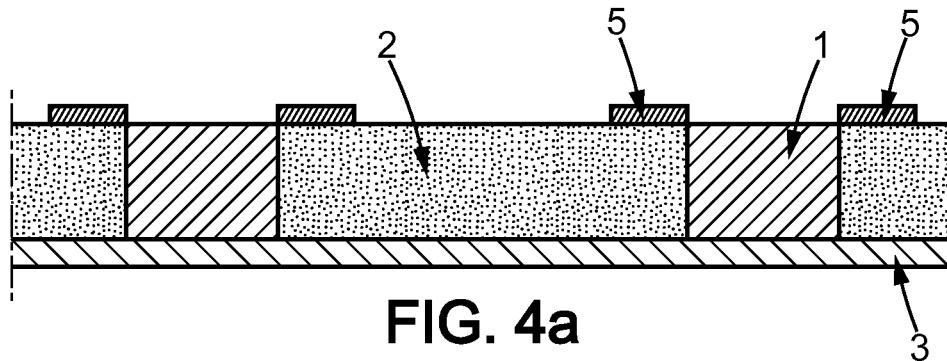
FIGS. 4a, 4b and 4c illustrate the steps of a method for fabricating an active photosensitive portion equipped with a lens and surrounded by an inactive portion, according to a third embodiment of the invention.
Figure 4B:
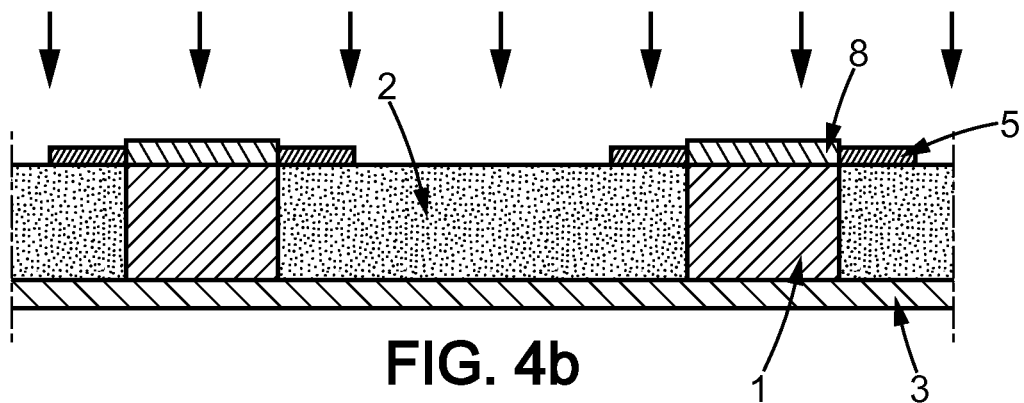
Figure 4C:
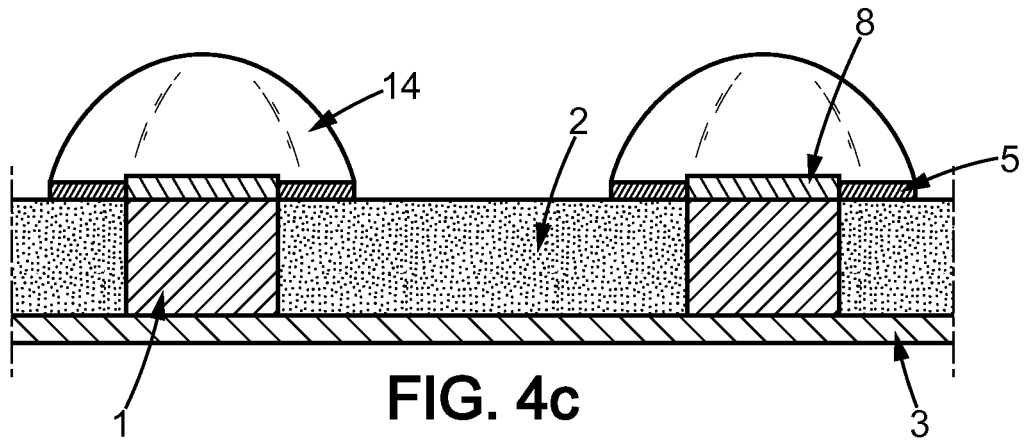

Also in relation to a first portion 1 forming a light absorber for a photovoltaic application, the periphery of the first portion 1 comprises, on a portion of the upper surface of the second portion 2, a metal electrical contact 5, as represented in FIG. 4*a*. These peripheral electrical contacts 5 are commonly used in light-concentrating photovoltaic systems in order to minimize resistive losses. These metal contacts 5 are advantageously connected to a current collection device. It is then possible to exploit the naturally hydrophilic properties of these metal contacts to extend the surface which the drops of liquid solution spread over during the step of spraying liquid solution onto the upper surfaces of the hydrophilic layer 8 and second portion 2. The steps associated with this process are shown in FIGS. 4*a*, 4*b* and 4*c*.

The metal contacts 5 can be selectively treated to adjust their hydrophilicity, for example with polymers. This treatment or functionalization of the metal 5 may be achieved by dipping in selective chemical solutions, for example thiol. This dipping may increase the hydrophilicity of the metal 5 or conversely may render it hydrophobic. The hydrophilic layer 8 and the metal can then be differentiated by the difference in their electrochemical behavior. The metal contact thus provides a degree of freedom in defining the hydrophilic area.

Deposition of the metal contacts 5 can occur in different stages of the process. According to a preferred embodiment, it occurs by deposition on the second portion 2, before recesses are formed in the second portion 2 that are intended to house the first active portions 1. Alternatively, the metal contacts 5 may be deposited after the first portions 1 are formed and before the layer 8 of hydrophilic material is deposited. In this embodiment, an effective electrical contact is created between the metal portion 5 and the first active portion 1 at the time of the deposition of the layer 8 of ZnO.

In order to protect the metal contacts 5 during thermal annealing at temperatures which can be between 500° C. and 600° C., occurring during production of the first portion 1, it is possible to cover the metal contacts 5 with a thin layer of oxide or carbide for example.

As suggested by FIG. 4*c*, it is possible to use the peripheral metal contact 5 to substantially adjust the size of the lens formed above the photovoltaic cell absorber.

The configuration shown in FIG. 4*c* does not include a spacer layer under the lens formed above the photovoltaic cell absorber. The light collected by the lens is concentrated by the optical power of the lens 14 which has a surface area greater than that of the surface area of the first active portion 1. The advantage of this is it allows the lens 14 to collect a greater amount of light, most of which is focused on the first active portion 1. Furthermore, the peripheral metal area 5 can act as a mirror reflecting the radiation, which can then be partially reflected in the lens and be focused on the absorber 1. This limits the optical losses in areas that do not contain an absorber 1.

Figure 5A:
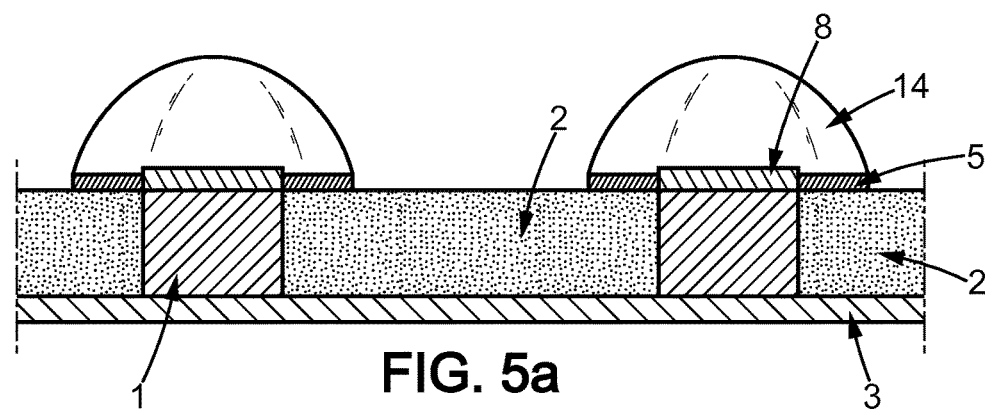
FIGS. 5a and 5b illustrate steps of a method for fabricating an active photosensitive portion equipped with a lens and surrounded by an inactive portion, according to a fourth embodiment of the invention.
Figure 5B:
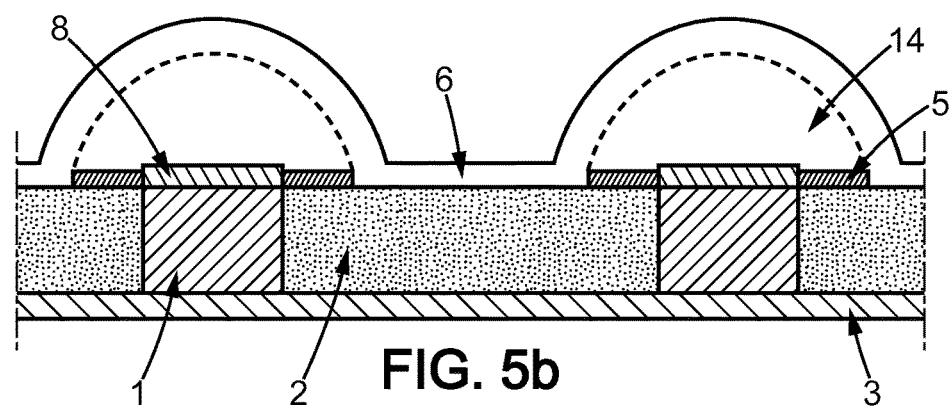

As represented in FIGS. 5*a* and 5*b*, it is possible to add an additional step of creating a spacer 6, after the step of forming the light concentration systems 14. The term "spacer" is used to designate a distancing, perpendicular to the substrate, between the light concentration system 14 and the first active portion 1. This spacer 6 is advantageously made by depositing a coating that uniformly and with a constant thickness covers the lens 14 and the second inactive portion 2. Advantageously, this spacer 6 is composed of a material having substantially the same refractive index as the lens 14. The spacer 6 gives two advantages: on the one hand, it thickens the light concentration system 14, enlarging the area exposed to incident radiation, and on the other hand it distances the lens 14 from the first active portion 1. It is thus possible to concentrate a noticeably larger amount of light on the first active portion 1, increasing the optical efficiency of the system. It would be advantageous, however, to limit the thickness of this spacer 6, because the profile of the microlenses 14 would not be maintained at large thicknesses.

Figure 6A:
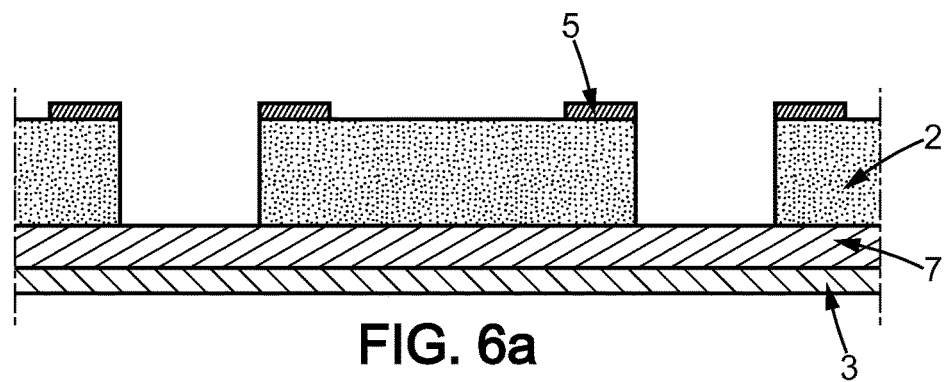
FIGS. 6a and 6b illustrate steps of a method for fabricating an active photosensitive portion equipped with a lens and surrounded by an inactive portion, according to a fifth embodiment of the invention.
Figure 6B:
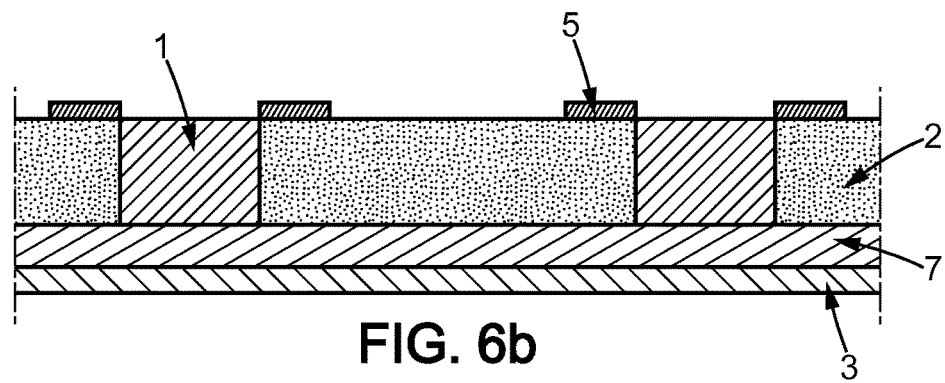

Another advantage associated with using the method for fabricating a thin-film photovoltaic cell is that it allows the possibility of an additional step during fabrication of the first 1 and second 2 portions. At first the substrate can be structured, as represented in FIGS. 6*a* and 6*b*, with only the inactive second portion 2 being present. This second portion 2 is generally formed of an electrical insulator. The first portion 1 is created by selective deposition via electrodeposition or ink deposition. This embodiment uses less of the raw materials required to fabricate light absorbers.

By depositing the second portion 2 before the first portion 1, it is also possible to improve the quality of deposition of the first portion 1. In fact, the electrodeposition of the first portion 1 then occurs naturally in the areas outside the second portion 2, in the space intended to receive the first portion 1. In ink-based deposition, the hydrophobic character of the second portion 2 and the height difference of this portion contribute to the selective deposition of the ink in the space intended to accept the first portion 1.

Naturally, when the photovoltaic cells are thin-film cells, it is advantageous to provide a conductive layer 7 forming a rear contact, created on the upper face of the substrate. This layer is traditionally a molybdenum layer in the case of cells based on copper, indium, gallium, and selenium, called CIGS cells. When the layer 7 is continuous, the photovoltaic cells are connected in parallel. The rear contact 7 may possibly be discontinuous, which allows connecting the cells serially.

Although the method described above relates to at least one first active portion 1 surrounded by a second inactive portion 2, it may advantageously relate to an array of first active portions 1, for example an array of photodetectors, LEDs, or photovoltaic cells, each first active portion 1 being surrounded by a second inactive portion 2.

The device resulting from the method described above provides a quality of alignment of the light concentration systems over the photosensitive cells that is superior to that obtained by alignment techniques making use of cameras and precision robots. By using the method described above, there are no positioning errors when aligning the lenses over the photovoltaic cells.

Exemplary Embodiment

Figure 7:
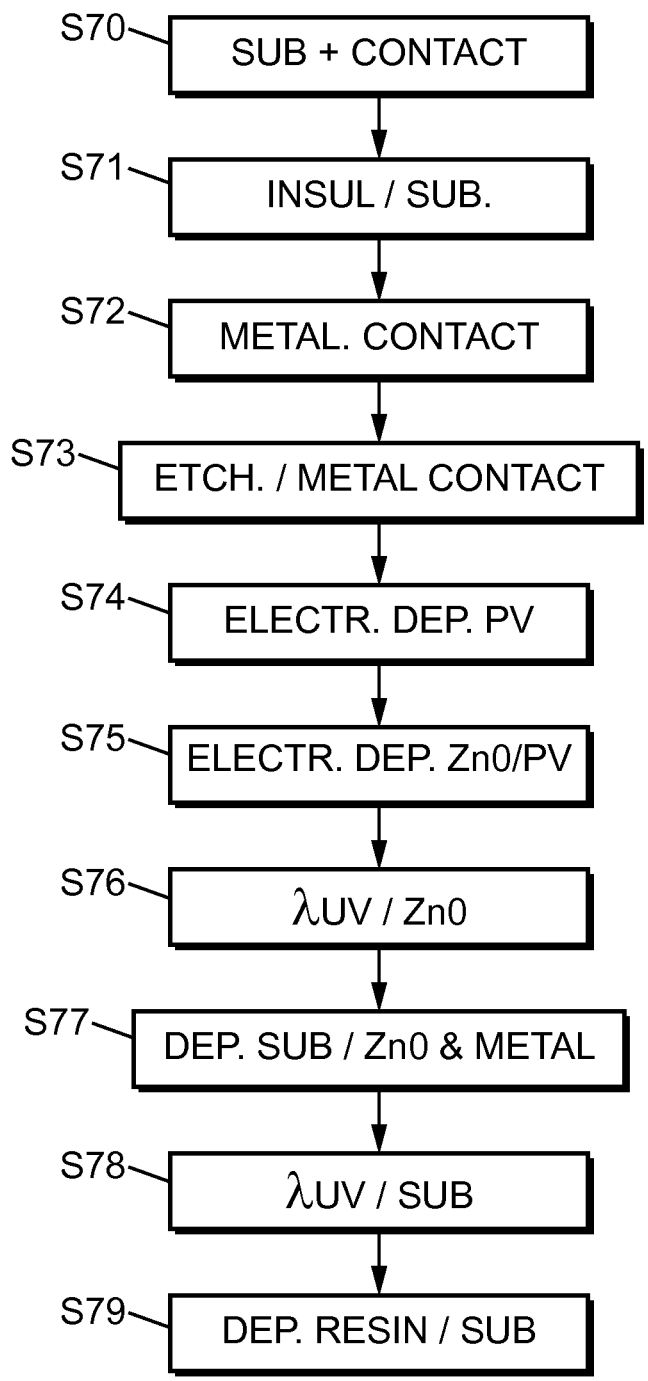
FIG. 7 illustrates the steps of a method for fabricating an active photosensitive portion equipped with a lens and surrounded by an inactive portion, according to a sixth embodiment of the invention.

As represented schematically in the ten steps in FIG. 7, the invention first proposes fabricating a substrate 3 comprising a layer 7 forming the rear contact. This first step S70 is followed by depositing an insulating layer 2 on said substrate 3 in step S71. On this substrate 3, equipped with a layer of insulating material 2 such as a SU8 resin, metal contacts 5 are deposited in step S72. Sites are then etched in the metal contacts 5 in step S73, extending to the layer forming the rear contact 7.

The next step S74 consists of selectively depositing the photovoltaic cell absorber 1, by electrodeposition or ink printing, for example an alloy such as $Cu(In,Ga)Se_2$. This deposition is followed by annealing at a temperature which may be between 500° C. and 600° C., to crystallize the material. In the step denoted S75, a wide-bandgap oxide such as ZnO is electrodeposited on the device obtained from the previous steps. The ZnO is selectively deposited on the photovoltaic cell absorbers 1, which are electrically conductive unlike the electrical insulators 2 that surround them. It is desirable for the ZnO layer 8 to be in contact with the metal of the metal contacts 5 surrounding the photovoltaic cell absorbers 1, this contact being determined by the deposition conditions of the layer 8. To be conductive, the ZnO is preferably doped.

This step is followed by step S76 of exposing the upper surfaces of ZnO to ultraviolet radiation. This exposure to ultraviolet radiation increases the hydrophilicity of the ZnO.

This is followed, in step S77, by deposition of a SU8 resin which is sprayed on the upper surfaces of the ZnO and electrical insulator 2. This leads to the formation of drops on the upper surfaces of ZnO which are also distributed across the peripheral metal contacts 5, also hydrophilic, while the SU8 resin spreads over the upper surface of the electrical insulator.

Next, exposure of said resin to ultraviolet radiation, in the step denoted S78, hardens the drops located on the assembly formed by the ZnO 8 and the metal contacts 5, thereby forming solid lenses 14 above the photovoltaic cells.

Lastly, deposition of a resin having a refractive index that is substantially identical to that of the lenses 14 is performed. This step, denoted S79, also includes hardening said resin, thereby forming a spacer 6 fulfilling the dual function of thickening the lenses and the layer to create distance between the outer surface of the lenses and the photovoltaic cells.

Exemplary Embodiment #2

First a substrate 3 comprising a layer forming a rear contact 7 is fabricated. This first step is followed by deposition of an insulating layer 2 on said substrate 3. On this substrate 3, equipped with a layer of insulating material 2 such as a polymer, alumina, or silica, recesses are then etched which extend all the way to the layer forming the rear contact 7.

The next step consists of selectively depositing the photovoltaic cell absorber 1, by electrodeposition or by ink printing, for example an alloy such as Cu(In,Ga)Se. This deposition is followed by annealing. In the next step, a wide-bandgap oxide 8 such as ZnO is deposited on the device obtained from the previous steps. This deposition is not necessarily selective, and may be done by spraying or chemical vapor deposition. A surface treatment can then be done to ensure the hydrophobicity of the layer 8 of wide-bandgap oxide. For example, stearic acid or teflon may be deposited on the surface.

This step is followed by an electrochemistry step in which the substrate 3 is immersed in an electrolyte and a potential is applied between the conductive regions, namely the first photosensitive portions 1, and the electrolyte. A current then flows through these first portions 1, changing the surface state of the ZnO. Thus the ZnO directly above the first portions 1 acquires a hydrophilic character, either by desorption of the hydrophobic surface deposition or by oxidation of this deposition, or by changing the surface state of the ZnO if a hydrophobic material was not deposited. This change in hydrophobicity/hydrophilicity is self-aligned over the devices because of the conductive nature of the first portions 1 and the isolating nature of the second portions 2.

This is followed by deposition of a SU8 resin which is sprayed on the upper surfaces of the ZnO and electrical insulator. This leads to the formation of drops on the upper surfaces of ZnO, while the SU8 resin spreads over the upper surface of the electrical insulator.

Next, exposure of said resin to ultraviolet radiation hardens the drops located on the assembly formed by the ZnO and the metal contacts, thereby forming solid lenses above the photovoltaic cells.

Lastly, a metal contact is deposited on the ZnO directly above the second portions 2. This deposition can be autocatalytic, because of the chemical contrast between the polymer lenses and the ZnO. It is also possible to achieve it electrochemically.

The invention is not limited to the embodiments described, and comprises equivalent embodiments.

For example, it is possible to envisage an array of photosensitive cells of different shapes and different optical properties, surrounded by inactive portions made of multiple different materials.

The lenses may also act as filters for selecting certain wavelengths within the spectrum of the incident radiation reaching the active portions.

The method of the invention can also be applied to the formation of optical systems directly above light-emitting diodes.

The invention claimed is:

1. A method for fabricating a photosensitive device, comprising:
    preparing, on a substrate, at least a photosensitive first portion that is active within a range of wavelengths and has electrical conduction properties, said first portion being surrounded by a second portion that is inactive and electrically insulating,
    selectively arranging a material, covering an upper surface of the first portion opposite the substrate, into a hydrophilic layer directly above the first active portion by an electrochemical process, while the second portion comprises a hydrophobic material on an upper surface opposite the substrate,
    the method further comprising:
    spraying, over the entire upper surfaces of said first and second portions, a liquid solution comprising a material that is transparent within said range of wavelengths,
    forming a converging lens comprising said material, over said first portion, and
    treating the upper surface of the first active portion by exposing said upper surface to ultraviolet radiation prior to spraying a liquid solution.

2. The method of claim 1, wherein the liquid solution comprises a hardening material.

3. The method of claim 2, wherein the hardening material is a monomer.

4. The method of claim 2, further comprising hardening the liquid solution to form a converging lens above the first portion.

5. The method of claim 2, further comprising hardening the liquid solution by exposing the upper surface of the first portion to ultraviolet radiation.

6. The method of claim 1, wherein preparing at least a photosensitive first portion comprises preparing, on a substrate, an array of first portions that are active within a range of wavelengths, said first portions being separated from each other by a second inactive portion.

7. The method of claim 6, wherein preparing at least a photosensitive first portion comprises a selective deposition of first portions on a substrate comprising the second portion.

8. The method of claim 1, further comprising selectively depositing a material having hydrophilic properties on the upper surface opposite the substrate of the first portion.

9. The method of claim 1, further comprising rendering the upper surface of the first portion opposite the substrate hydrophilic after treatment.

10. The method of claim 1, wherein the hydrophilic material is a wide-bandgap oxide.

11. The method of claim 1, further comprising selecting the hydrophilic material from among the group consisting of ZnO, doped ZnO, and $TiO_2$.

12. The method of claim 1, further comprising treating the first active portion by applying an electric potential prior to spraying a liquid solution.

13. The method of claim 1, further comprising, after preparing at least a photosensitive first portion and prior to spraying a liquid solution:
   depositing, on part of the upper surface of the second portion, a hydrophilic metal layer in contact with the first portion.

14. The method of claim 1, wherein the first, active, portion is a light absorber of a photosensitive cell.

15. The method of claim 1, wherein the second, inactive, portion is an electrical insulator.

16. The method of claim 1, further comprising depositing, on the lens, a coating of a material that is transparent within the range of wavelengths.

17. A photosensitive device comprising, on a substrate:
   at least a first photosensitive portion which is active within a range of wavelengths and has electrical conduction properties,
   a second inactive portion that is electrically insulating, surrounding said first portion,
   wherein said first portion comprises a material selectively arranged into a hydrophilic layer directly above the first active portion by an electrochemical process on an upper surface opposite the substrate, while the upper surface opposite the substrate of said second portion comprises a hydrophobic material,
   wherein a converging lens is formed on the upper surface of the hydrophilic material, and wherein a hydrophilic metal layer in contact with the first portion is arranged on part of the upper surface of the second portion.

18. A method for fabricating a photosensitive device, comprising:
   preparing, on a substrate, at least a photosensitive first portion that is active within a range of wavelengths and has electrical conduction properties, said first portion being surrounded by a second portion that is inactive and electrically insulating,
selectively arranging a material, covering an upper surface of the first portion opposite the substrate, into a hydrophilic layer directly above the first active portion by an electrochemical process, while the second portion comprises a hydrophobic material on an upper surface opposite the substrate, the method further comprising:
   spraying, over the entire upper surfaces of said first and second portions, a liquid solution comprising a material that is transparent within said range of wavelengths, and
   forming a converging lens comprising said material, over said first portion,
   treating the first active portion by applying an electric potential prior to spraying a liquid solution.

* * * * *